(12) United States Patent
Lee et al.

(10) Patent No.: US 7,027,351 B2
(45) Date of Patent: Apr. 11, 2006

(54) NEGATIVE WORD LINE DRIVER

(75) Inventors: Kang Seol Lee, Seoul (KR); Yong Mi Kim, Cheonnju-Shi (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 10/881,056

(22) Filed: Jun. 30, 2004

(65) Prior Publication Data

US 2005/0128858 A1    Jun. 16, 2005

(30) Foreign Application Priority Data

Dec. 15, 2003  (KR) .................. 10-2003-0091647

(51) Int. Cl.
*G11C 8/00* (2006.01)
(52) U.S. Cl. .................. 365/230.06; 365/230.08; 365/230.03
(58) Field of Classification Search ........... 365/230.06, 365/230.08, 230.03
See application file for complete search history.

(56) References Cited

U.S. PATENT DOCUMENTS

| | | | | |
|---|---|---|---|---|
| 5,966,331 A | | 10/1999 | Shiau et al. | 365/185.123 |
| 6,597,621 B1 | * | 7/2003 | Tsuji et al. | 365/230.06 |
| 6,665,229 B1 | | 12/2003 | Lee et al. | 365/230.06 |
| 2002/0176312 A1 | | 11/2002 | Lee et al. | 365/230.06 |

* cited by examiner

*Primary Examiner*—Huan Hoang
(74) *Attorney, Agent, or Firm*—Marshall, Gerstein & Borun LLP

(57) ABSTRACT

Provided is directed to a negative word line driver, including: a block select address generation unit for generating first and second block select addresses having a block information according to an active signal; a row decoder controller for generating a control signal to disable a word line; a main word line driver for accessing a main word line by being driven in response to a signal coding the first block select address and the control signal; and a phi X driver for accessing a sub word line by being driven in response to a signal coding the second block select address and the control signal wloff.

16 Claims, 6 Drawing Sheets

NEGATIVE WORD LINE DRIVER

This application relies for priority upon Korean Patent Application No. 2003-0091647 filed on Dec. 15, 2003, the contents of which are herein incorporated by reference in their entirety.

BACKGROUND

1. Field of the Invention

The present invention relates to a semiconductor memory device, and more particularly to, a negative word line driver in a semiconductor memory device.

2. Discussion of Related Art

The negative word line driver supplies VPP to a word line when enabling the word line, while supplying a voltage (hereinafter, denoted with VBBW) lower than VSS to a word line when disabling the word line.

As using this negative word line driving method, a refresh characteristic is improved as well as other AC parameters are. Especially, it increases a refresh time and decreases a VPP burden while using a low Vcc. Moreover, the negative word line driving method is employed in order to improve a write recovery time TWR.

It will be described about a negative word line driving method of conventional art in FIG. 1 with reference to FIGS. 1 to 4.

Figure 1:
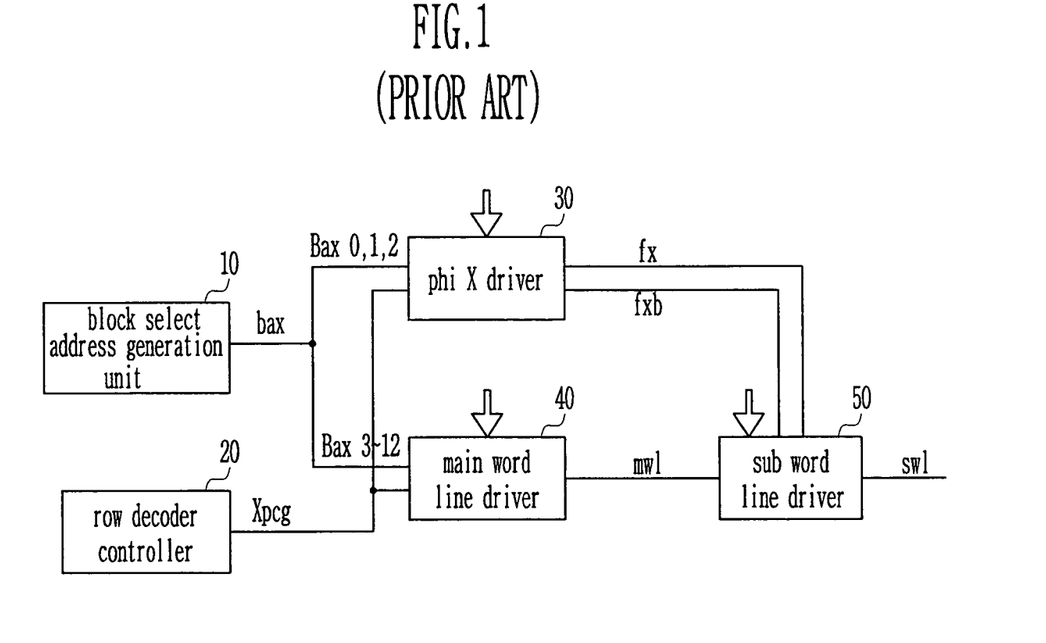
FIG. 1 is a block diagram illustrating a negative word line driver of the conventional art.

Referring to FIG. 1, a block select address Bax having a block information is generated from a select address generation unit 10 according to an active signal. As a main word line driver 40 is driven by block select addresses Bax3–12, a main word line mwl is selected. On the other hand, a phi X driver 30 is driven by block select addresses Bax0, 1, 2, and a sub word line driver 50 is driven by outputs fx, fxb of the phi X driver 30, to select a sub word line swl.

A row decoder controller 20 generates a precharge signal Xpcg for disabling a word line. The precharge signal Xpcg controls the phi X driver 30 and the main word line 40. That is, enabling a word line is performed in response to the block select address Bax, while disabling a word line is performed in response to the precharge signal Xpcg.

Figure 2:
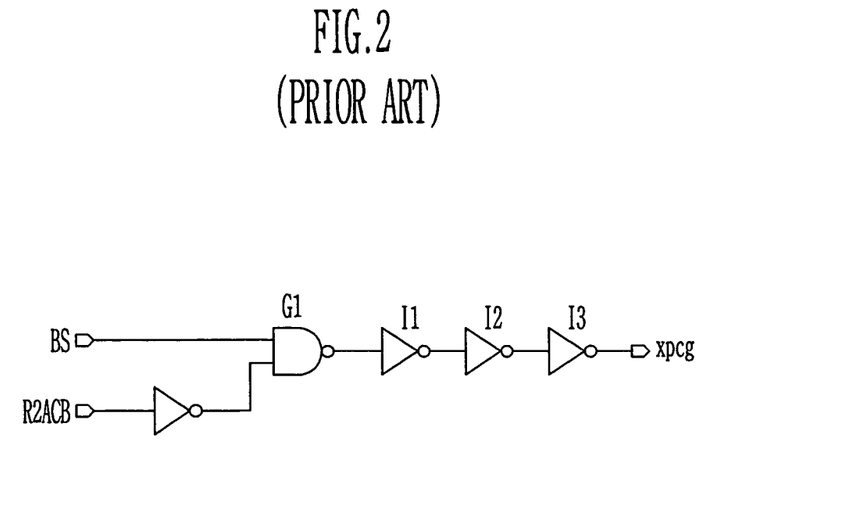
FIG. 2 is a detailed circuit diagram illustrating a row decoder controller of FIG. 1.

FIG. 2 is a detailed circuit diagram illustrating a row decoder controller of FIG. 1.

A NAND gate G1 combines a reverse signal of a signal R2ACB deciding a precharging timing and a block select enable signal BS, and then the output signal of the NAND gate G1 passes through inverters I1 to I3. Accordingly, an output of the inverter I3 becomes the precharge signal Xpcg.

Figure 3:
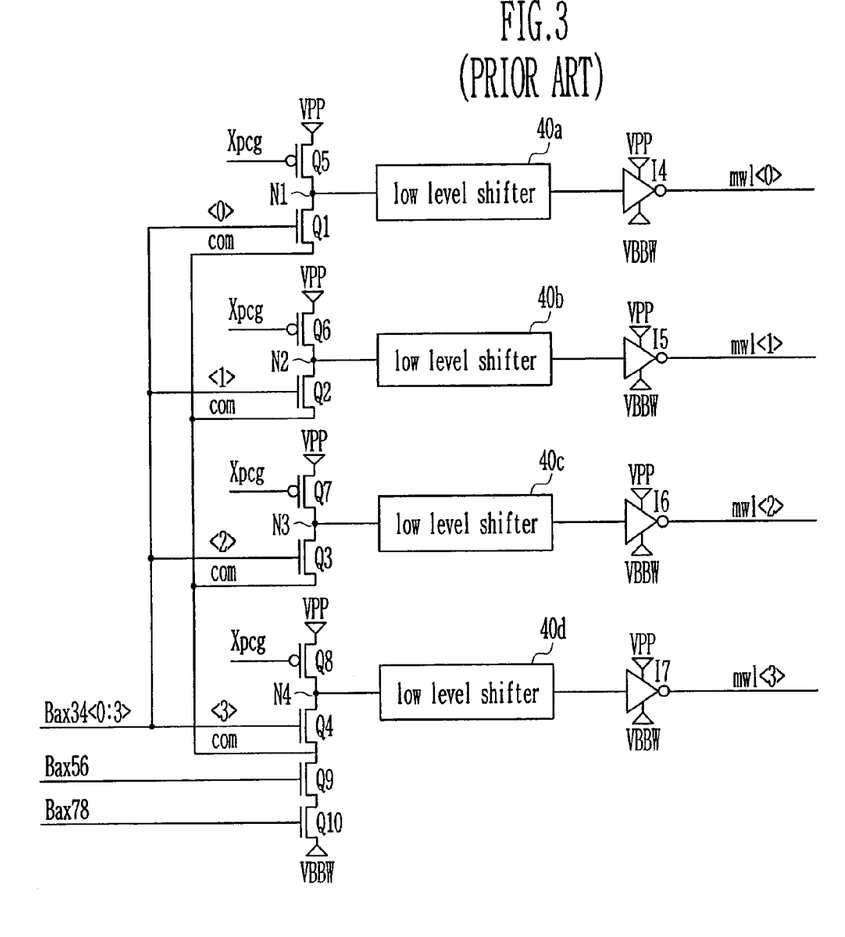
FIG. 3 is a detailed circuit diagram illustrating a main word line driver of FIG. 1.

FIG. 3 is a detailed circuit diagram illustrating a main word line driver of FIG. 1.

Signals Bax34<0:3> which have predecoded a block select address Bax34 are applied to gates of NMOS transistors Q1, Q2, Q3, Q4 and each source of the NMOS transistors Q1, Q2, Q3, Q4 is connected to a common node com.

One of signals Bax56<0:3> which have predecoded a block select address Bax56 is applied to a gate of NMOS transistor Q9 and one of signals Bax78<0:3> which have predecoded a block select address Bax78 is applied to a gate of NMOS transistor Q10. As a result, the NMOS transistors Q9, Q10 are turned on or off thereto. In condition that the NMOS transistors Q9, Q10 are turned on, When the NMOS transistor Q1 is turned on according to the predecoded signal Bax34<0>, a potential of node N1 becomes VBBW level. As the same to it, when the NMOS transistor Q2 is turned on according to the predecoded signal Bax34<1>, a potential of node N2 becomes VBBW level. When the NMOS transistor Q3 is turned on according to the predecoded signal Bax34<2>, a potential of node N3 becomes VBBW level. Additionally, when the NMOS transistor Q4 is turned on according to the predecoded signal Bax34<3>, a potential of node N4 becomes VBBW level.

On the other hand, when the precharge signal Xpcg is enabled, a signal predecoding a block select address is disabled, which results in that the NMOS transistors Q1 to Q4 are turned off and PMOS transistors Q5, Q6, Q7, Q8 are turned on. Accordingly, the nodes N1, N2, N3, N4 become high level.

The level of node N1 is shifted to VPP or VBBW level according to a low level shifter 40a, the level of node N2 is shifted to VPP or VBBW level according to a low level shifter 40b, and the level of node N3 is shifted to VPP or VBBW level according to a low level shifter 40c. Furthermore, the level of node N4 is shifted to VPP or VBBW level according to a low level shifter 40d.

Each output of each low level shifter 40a 40d is inverted by corresponding inverter I4 to I7. A first main word line mwl<0> is driven or precharged in response to an output of the inverter I4. A second main word line mwl<1> is driven or precharged in response to an output of the inverter I5. A third main word line mwl<2> is driven or precharged in response to an output of the inverter I6. A fourth main word line mwl<3> is driven or precharged in response to an output of the inverter I7.

Figure 4:
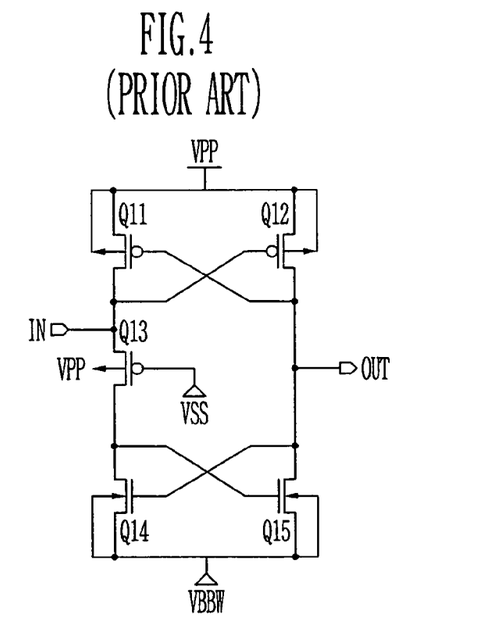
FIG. 4 is a detailed circuit diagram illustrating a level shifter of FIG. 3.

FIG. 4 is a detailed circuit diagram illustrating the level shifter of FIG. 3.

Because a PMOS transistor Q13 is turned on, when an input signal IN, namely, each node N1 to N4 of FIG. 3, is high level, a PMOS transistor Q11 and a NMOS transistor Q15 are turned on. As a result, the level shifter of FIG. 4 outputs VBBW. On the other hand, when the input signal IN is low level, a NMOS transistor Q14 and a PMOS transistor Q12 are turned on. As a result, the level shifter of FIG. 4 outputs VPP.

In the aforementioned conventional art, in order to precharge each main word line, that is, to become VBBW level, level shifters are connected to each main word line as shown in FIG. 3.

For instance, when each memory block uses 512 numbers of word lines and a phi X driver is coded by 4:1, 128 numbers of main word lines are required, and thus 128 numbers of level shifters should be connected to each main word line. Although the phi X driver is coded by 8:1, 64 numbers of main word lines are required, and thus the number of level shifters also needs as same as the number of main word lines.

Therefore, it causes problems that a chip size is increased and a signal for precharing a word line is delayed.

SUMMARY OF THE INVENTION

The present invention is directed to provide a negative word line driver capable of solving the aforementioned problems.

Another object of the present invention is provide a negative word line driver capable of enabling or disabling main word lines without connecting level shifters with main word lines.

One aspect of the present invention is to provide a negative word line driver, including: a block select address generation unit for generating first and second block select addresses Bax having a block information according to an active signal; a row decoder controller for generating a control signal for disabling a word line; a main word line driver for accessing a main word line by being driven in response to a signal coding the first block select address and the control signal; and a phi X driver for accessing a sub word line by being driven in response to a signal coding the second block select address and the control signal.

Another aspect of the present invention is to provided a negative word line driver, including: a block select address generation unit for generating first and second block select addresses Bax having a block information according to an active signal; a row decoder controller for generating a control signal to disable a word line; a main word line driver for making a main word line low level according to a signal coding the first block select address, and also making the main word line high level according to the control signal; and a phi X driver for accessing a sub word line by being driven in response to a signal coding the second block select address and the control signal.

BRIEF DESCRIPTION OF THE DRAWINGS

A more complete understanding of the present invention may be had by reference to the following description when taken in conjunction with the accompanying drawings in which.

DETAILED DESCRIPTION OF PREFERRED EMBODIMENTS

Hereinafter, it will be described about embodiments of the present invention with reference to the accompanying drawings in detail.

Figure 5:
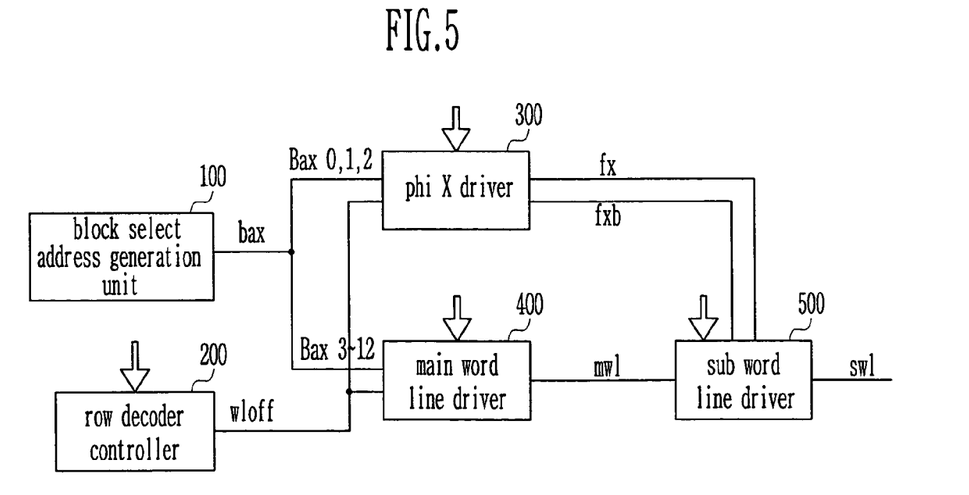
FIG. 5 is a block diagram illustrating a negative word line driver in accordance with the present invention.

FIG. 5 is a block diagram illustrating a negative word line driver in accordance with the present invention.

Referring to FIG. 5, a block select address Bax having a block information is generated from a block select address generation unit 100 according to an active signal. A row decoder controller 200 generates a control signal wloff for disabling a word line. A main word line driver 400 is driven by block select addresses Bax3–12 and the control signal wloff and thus a main word line mwl is accessed. On the other hand, a phi X driver 300 is driven by block select address Bax0, 1, 2 and the control signal wloff, and a sub word line driver 500 is driven by outputs fx, fxb of the phi X driver. Accordingly, a sub word line swl is accessed.

That is, enabling a word line is performed according to the block select address Bax, while disabling a word line is performed according to the control signal wloff.

Figure 6:
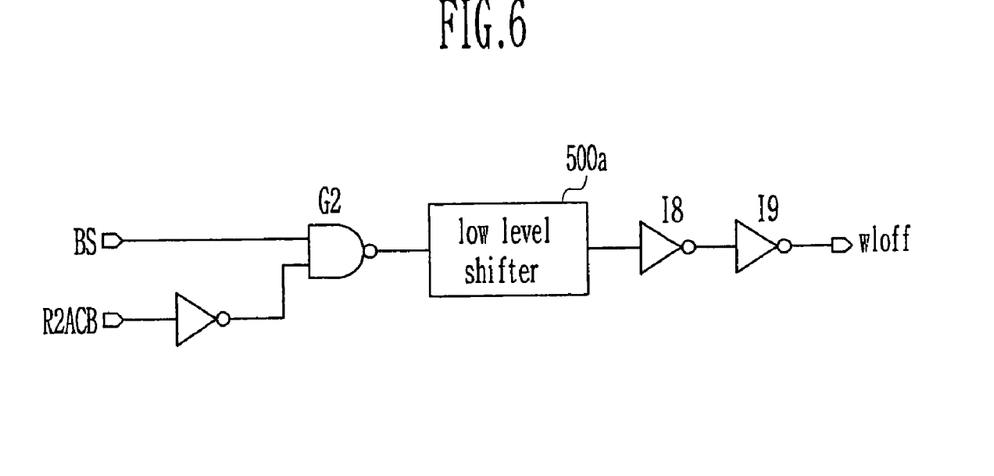
FIG. 6 is a detailed circuit diagram illustrating a row decoder controller of FIG. 5.

FIG. 6 is a detailed circuit diagram illustrating a row decoder controller of FIG. 5.

A NAND gate G2 combines a reverse signal of a signal R2ACB deciding a precharging timing and a block select enable signal BS. An output level of the NAND gate G2 is shifted by a low level shifter 500a. An output of the level shifter 500a passes through inverters I8 to I9. An output of an inverter I9 becomes the control signal wloff. As shown in FIG. 6, when the block select enable signal BS is high level and the signal R2ACB deciding the precharing timing is low level, the control signal wloff falls down to low level.

Figure 7:
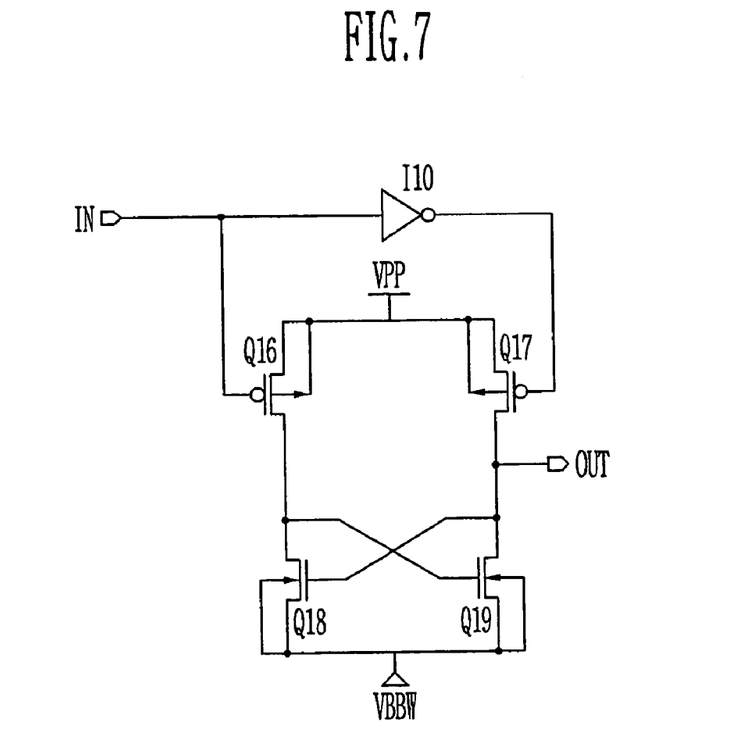
FIG. 7 is a detailed circuit diagram illustrating a level shifter of FIG. 5.

FIG. 7 is a detailed circuit diagram illustrating the level shifter of FIG. 6.

When the input signal IN is high level, a PMOS transistor Q17 is turned on according to an output of an inverter I10, and thus a NMOS transistor Q18 is turned on. As a result of this, the level shifter of FIG. 7 outputs VPP. On the other hand, when the input signal IN is low level, a PMOS transistor Q16 is turned on, and thus a NMOS transistor Q19 is turned on. As a result of this, the level shifter of FIG. 7 outputs VBBW.

Figure 8:
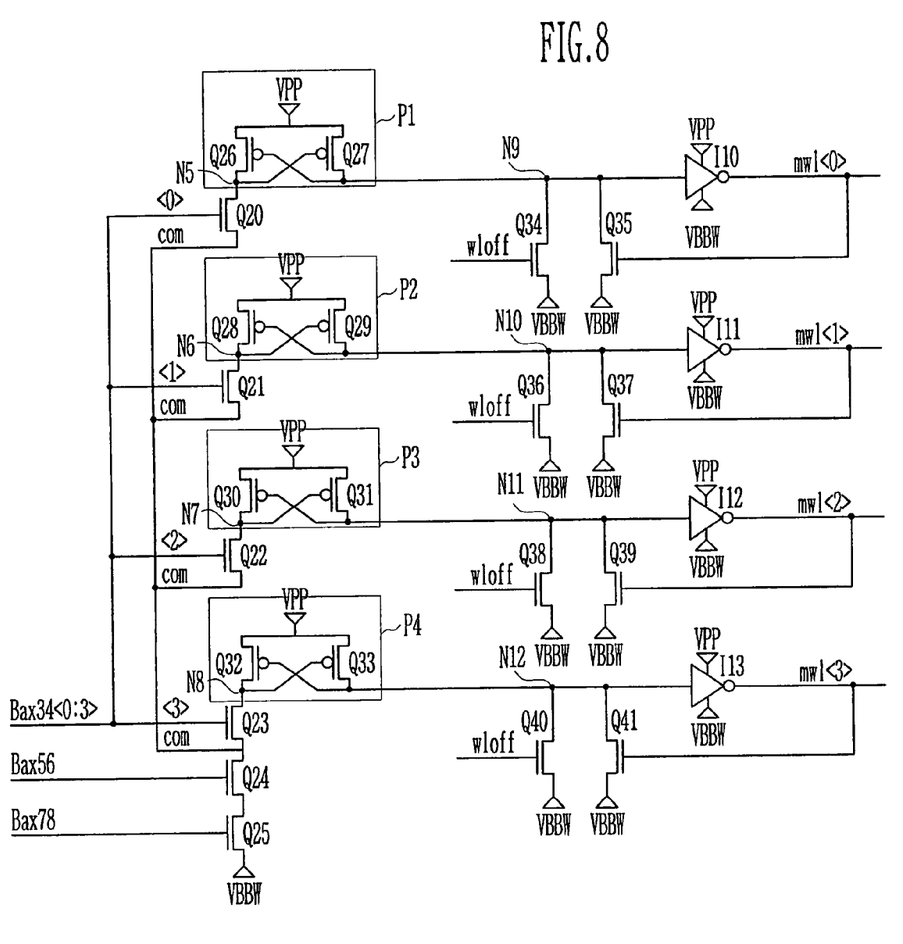
FIG. 8 is a detailed circuit diagram illustrating a main word line driver of FIG. 5.

FIG. 8 is a detailed circuit diagram illustrating a main word line driver of FIG. 5.

When the control signal wloff from a row decoder controller 200 is high level, NMOS transistors Q34, Q36, Q38, Q40 and each PMOS transistor Q26, Q28, Q30, Q32 in pairs of cross-coupled PMOS transistors P1 to P4 are turned on. Therefore, nodes N9, N10, N11, N12 become VBBW level and thus each output of inverters I10 to I13 becomes high level (VPP level). Accordingly, first to fourth main word lines mwl<0> to mwl<3> are enabled to VPP level. When the first to fourth main word lines mwl<0> to mwl<3> are enabled to VPP level, each NMOS transistors Q35, Q37, Q39, Q41 is turned on and thus VBBW level of each node N9, N12 is latched thereto.

The signals Bax34<0:3> which have predecoded a block select address Bax34 are respectively applied to NMOS transistors Q20, Q21, Q22, Q23. And each source of NMOS transistors Q20 to Q23 is connected to a common node com.

Moreover, one of signals Bax56<0:3> which have predecoded a block select address Bax56 is applied to a gate of a NMOS transistor Q24 and one of signals Bax78<0:3> which have predecoded a block select address Bax78 is applied to a gate of a NMOS transistor Q25. As a result, the NMOS transistors Q24, Q25 are turned on or off thereto.

In condition that the NMOS transistors Q24, Q25 are turned on, when the NMOS transistor Q20 is turned on according to the predecoded signal Bax34<0>, a potential of node N5 becomes VBBW level, which leads the PMOS transistor Q27 to be turned on. Therefore, a potential of node N9 is transited from VBBW level to VPP level. As the same to it, when the NMOS transistor Q21 is turned on according to the predecoded signal Bax34<1>, a potential of node N6 becomes VBBW level, which leads the PMOS transistor Q29 to be turned on. Therefore, a potential of node N10 is transited from VBBW level to VPP level. When the NMOS transistor Q22 is turned on according to the predecoded signal Bax34<2>, a potential of node N7 becomes VBBW level and thus the PMOS transistor Q31 is turned on. Accordingly, a potential of node N11 is transited from VBBW level to VPP level. When the NMOS transistor Q23 is turned on according to the predecoded signal Bax34<3>, a potential of node N8 becomes VBBW level and thus the PMOS transistor Q33 is turned on. Accordingly, a potential of node N12 is transited from VBBW level to VPP level.

As a potential of each node N9 to N12 is inverted by inverters 10 to 113, each word line mwl<0> to mwl<3> becomes VBBW level.

Figure 9:
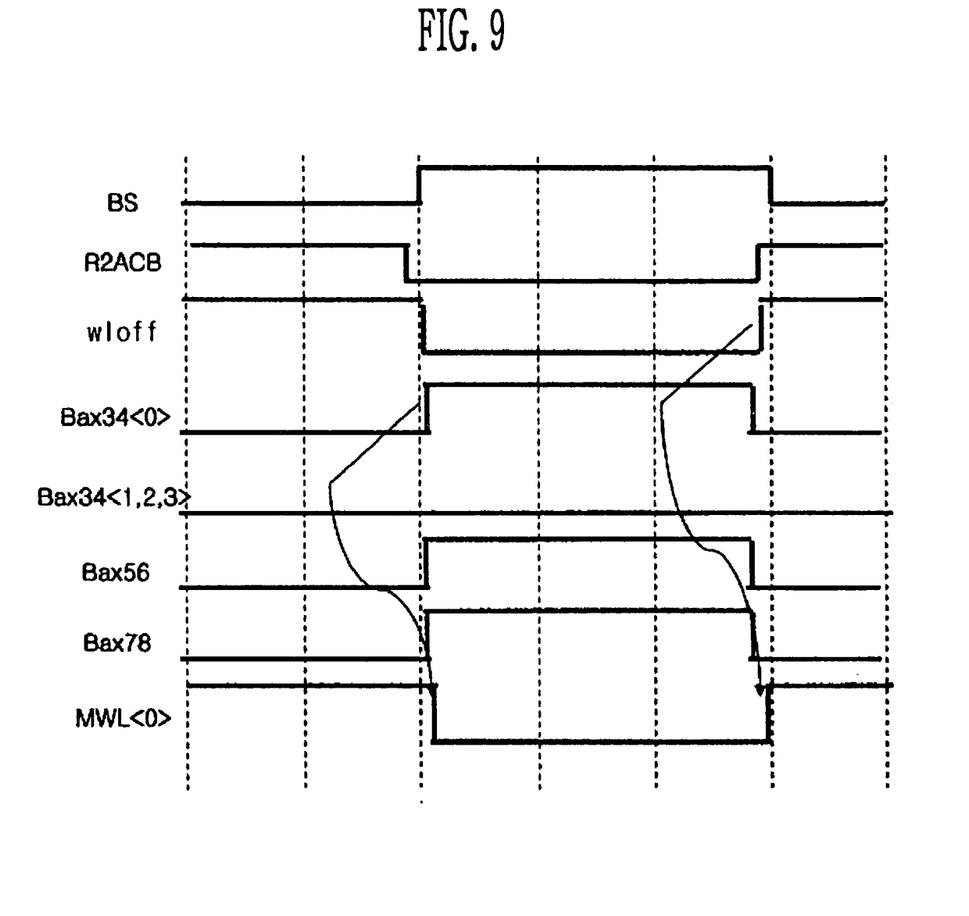
FIG. 9 is a timing diagram illustrating an operation of a negative word line driver in accordance with the present invention.

It will be described about the present invention with reference to FIG. 9 as follows.

When the block select enable signal BS is high level and the signal R2ACB deciding the precharging timing is low level, the control signal wloff becomes low level. For instance, when the signals Bax34<0>, Bax56, Bax78 coding the block select address are high level, the first main word line is disabled to low level VBBW.

Contrarily, when the block select enable signal BS is low level and the signal R2ACB deciding the precharging timing is high level, the control signal wloff becomes high level. For instance, the signals Bax34<0>, Bax56, Bax78 coding the block select address are low level, the first main word line is enabled to high level VPP.

As described earlier, the present invention can remarkably reduce a chip size by remarkably reducing the number of level shifters. Furthermore, a delay path can be reduced by shifting level in a main word line driver at the same time.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A negative word line driver, comprising:
   a block select address generation unit for generating first and second block select addresses having a block information according to an active signal;
   a row decoder controller for generating a control signal to disable a word line, with the row decoder controller including a low level shifter for shifting level of the control signal;
   a main word line driver for accessing a main word line by being driven in response to a signal coding the first block select address and the control signal; and
   a phi X driver for accessing a sub word line by being driven in response to a signal coding the second block select address and the control signal.

2. The negative word line driver of claim 1, wherein the row decoder controller comprises:
   a first logic circuit for combining a signal deciding a precharging timing and a block select enable signal; and
   the low level shifter for shifting level of an output of the first logic circuit.

3. The negative word line driver of claim 2, wherein the first logic circuit comprises:
   an inverter for inverting the signal deciding a precharging timing; and
   a NAND gate for combining the block select enable signal and an output of the inverter.

4. The negative word line driver of claim 2, wherein the low level shifter comprises:
   a first PMOS transistor turned on according to a signal inverting an output of the first logic circuit and also connected between a high level power supply and an output node;
   a second PMOS transistor turned on according to the output of the first logic circuit and also connected between a VDD power supply and a first node;
   a first NMOS transistor connected between the output node and a low level power supply and also turned on according to a potential of the first node; and
   a second NMOS transistor connected between the first node and the low level power supply and also turned on according to a potential of the output node.

5. The negative word line driver of claim 1, wherein the main word line driver comprises:
   a first means for making a main word line low level according to the signal coding the first block select address; and
   a second means for making the main word line high level according to the control signal.

6. The negative word line driver of claim 5, wherein the second means comprises a second NMOS transistor for making the main word line high level according to the control signal.

7. The negative word line driver of claim 5, wherein the first means comprises:
   first and second PMOS transistors cross-coupled between a high level power supply and first and second nodes;
   a first NMOS transistor for making the first node low level according to the signal coding the first block select address; and
   an inverter for making the main word line high level by inverting a potential of the second node.

8. The negative word line driver of claim 7, further comprising a latch for latching a potential of the second node to low level by being turned on according to a potential of the main word line.

9. A negative word line driver, comprising:
   a block select address generation unit for generating first and second block select addresses Bax having a block information according to an active signal;
   a row decoder controller for generating a control signal to disable a word line, with the row decoder controller including a low level shifter for shifting level of the control signal;
   a main word line driver for making a main word line low level according to a signal coding the first block select address, and also making the main word line high level according to the control signal; and
   a phi X driver for accessing a sub word line by being driven in response to a signal coding the second block select address and the control signal.

10. The negative word line driver of claim 9, wherein the row decoder controller comprises:
    a first logic circuit for combining a signal deciding a precharging timing and a block select enable signal; and
    the low level shifter for shifting level of an output of the first logic circuit.

11. The negative word line driver of claim 10, wherein the first logic circuit comprises:
    an inverter for inverting the signal deciding a precharing timing; and
    a NAND gate for combining the block select enable signal and an output of the inverter.

12. The negative word line driver of claim 10, wherein the low level shifter comprises:
    a first PMOS transistor turned on according to a signal inverting an output of the first logic circuit and also connected between a high level power supply and an output node;
    a second PMOS transistor turned on according to the output of the first logic circuit and also connected between a VPP power supply and a first node;

a first NMOS transistor connected between the output node and a low level power supply and also turned on according to a potential of the first node; and a second NMOS transistor connected between the first node and a low level power supply and also turned on according a potential of the output node.

13. The negative word line driver of claim 9, wherein the main word line driver comprises:

a first means for making a main word line low level according to the signal coding the first block select address; and a second means for making the main word line high level according to the control signal.

14. The negative word line driver of claim 13, wherein the first means comprises:

first and second PMOS transistors cross-coupled between a high level power supply and first and second nodes;

a first NMOS transistor for making the first node low level according to the signal coding the first block select address; and an inverter for making the main word line high level by inverting a potential of the second node.

15. The negative word line driver of claim 13, wherein the second means comprises a second NMOS transistor for making the main word line high level according to the control signal.

16. The negative word line driver of claim 13, further comprising a latch for latching a potential of the second node to low level by being turned on according to a potential of the main word line.

* * * * *

UNITED STATES PATENT AND TRADEMARK OFFICE
CERTIFICATE OF CORRECTION

PATENT NO.        : 7,027,351 B2                                         Page 1 of 1
APPLICATION NO.   : 10/881056
DATED             : April 11, 2006
INVENTOR(S)       : Kang S. Lee et al.

It is certified that error appears in the above-identified patent and that said Letters Patent is hereby corrected as shown below:

Claim 1 at Column 5, line 37, "shifting level" should be -- shifting a level --.

Claim 2 at Column 5, line 50, "shifting level" should be -- shifting a level --.

Claim 9 at Column 6, line 37, "shifting level" should be -- shifting a level --.

Claim 11 at Column 6, line 55, "precharing" should be -- precharging --.

Claim 12 at Column 7, line 6, "according a" should be -- according to a --.

Signed and Sealed this
Thirteenth Day of September, 2011

David J. Kappos
*Director of the United States Patent and Trademark Office*